(12) United States Patent
Inoue

(10) Patent No.: US 11,077,744 B2
(45) Date of Patent: Aug. 3, 2021

(54) BATTERY PACK

(71) Applicant: DENSO CORPORATION, Kariya (JP)

(72) Inventor: Yoshimitsu Inoue, Kariya (JP)

(73) Assignee: DENSO CORPORATION, Kariya (JP)

( * ) Notice: Subject to any disclaimer, the term of this patent is extended or adjusted under 35 U.S.C. 154(b) by 103 days.

(21) Appl. No.: 15/841,725

(22) Filed: Dec. 14, 2017

(65) Prior Publication Data

US 2018/0166668 A1 Jun. 14, 2018

(30) Foreign Application Priority Data

Dec. 14, 2016 (JP) .............................. JP2016-242329

(51) Int. Cl.
| | |
|---|---|
| *B60K 1/04* | (2019.01) |
| *H01M 10/42* | (2006.01) |
| *H02J 7/00* | (2006.01) |
| *H01M 10/44* | (2006.01) |
| *H01M 10/6551* | (2014.01) |

(Continued)

(52) U.S. Cl.
CPC ................ *B60K 1/04* (2013.01); *B60L 50/64* (2019.02); *B60L 58/26* (2019.02); *H01M 10/425* (2013.01); *H01M 10/44* (2013.01); *H01M 10/613* (2015.04); *H01M 10/625* (2015.04); *H01M 10/6551* (2015.04); *H01M 10/6554* (2015.04); *H01M 50/20* (2021.01); *H02J 7/00* (2013.01); *H02J 7/007* (2013.01); *B60K 1/00* (2013.01); *B60K 11/06* (2013.01); *B60K 2001/003* (2013.01); *B60K 2001/0416* (2013.01); *B60K 2001/0422* (2013.01); *B60K 2001/0427* (2013.01); *B60K 2001/0433* (2013.01); *B60L 2240/545* (2013.01);

(Continued)

(58) Field of Classification Search
CPC ............ H01M 10/613; H01M 10/4257; B60L 11/1864; B60L 11/1861; B60L 11/1874; B60L 11/1879
USPC ......................................................... 320/109
See application file for complete search history.

(56) References Cited

U.S. PATENT DOCUMENTS

| | | | | |
|---|---|---|---|---|
| 5,488,283 | A | * | 1/1996 | Dougherty ........ H01M 10/0413 307/10.1 |
| 6,462,410 | B1 | * | 10/2002 | Novotny ................. H01L 23/34 257/704 |

(Continued)

FOREIGN PATENT DOCUMENTS

| | | |
|---|---|---|
| JP | 2014-013722 A | 1/2014 |
| JP | 2014-165100 A | 9/2014 |
| JP | 2015-153675 A | 8/2015 |

*Primary Examiner* — David V Henze-Gongola
*Assistant Examiner* — Tarikh Kanem Rankine
(74) *Attorney, Agent, or Firm* — Oliff PLC

(57) ABSTRACT

A battery pack has a plurality of unit cells, a casing for accommodating the plurality of unit cells, and a base which is a part of the casing and has a heat dissipation wall and a first side wall disposed so as to be capable of transferring heat to the heat dissipation wall. The battery pack includes a stay disposed on the first side wall in the base and fixed to a vehicle-side member, and a switching device disposed so that released heat can be transferred to the heat dissipation wall or the first side wall. The switching device includes a first switching device and a third switching device having a smaller heating value than the first switching device has. The first switching device is disposed at a position closer to the stay than the third switching device is in planar view.

5 Claims, 8 Drawing Sheets

(51) Int. Cl.
  *H01M 10/6554* (2014.01)
  *H01M 10/613* (2014.01)
  *H01M 10/625* (2014.01)
  *B60L 58/26* (2019.01)
  *B60L 50/64* (2019.01)
  *H01M 50/20* (2021.01)
  *B60K 11/06* (2006.01)
  *B60K 1/00* (2006.01)
  *G01R 31/396* (2019.01)

(52) U.S. Cl.
  CPC ......... *B60Y 2400/61* (2013.01); *G01R 31/396* (2019.01); *H02J 7/0047* (2013.01)

(56) References Cited

U.S. PATENT DOCUMENTS

| | | | | |
|---|---|---|---|---|
| 9,211,800 B2* | 12/2015 | Nishi | .................... | H02J 7/0016 |
| 9,752,767 B1* | 9/2017 | Moghal | .................... | F21V 29/60 |
| 2003/0103333 A1* | 6/2003 | Daikoku | .................... | H01L 23/10 |
| | | | | 361/719 |
| 2003/0155644 A1* | 8/2003 | Hirao | .................... | H01L 25/072 |
| | | | | 257/706 |
| 2006/0250765 A1* | 11/2006 | Yamabuchi | ........ | H05K 7/20927 |
| | | | | 361/679.01 |
| 2009/0289600 A1* | 11/2009 | Lin | .................... | B60L 58/20 |
| | | | | 320/134 |
| 2010/0066302 A1* | 3/2010 | Gregg | .................... | B60W 10/26 |
| | | | | 320/104 |
| 2010/0077741 A1* | 4/2010 | Samuel | .................... | B60K 6/48 |
| | | | | 60/320 |
| 2011/0104521 A1* | 5/2011 | Kishimoto | .......... | H01M 2/1077 |
| | | | | 429/7 |
| 2011/0148190 A1* | 6/2011 | Gronwald | ............. | B60L 3/0069 |
| | | | | 307/9.1 |
| 2011/0279969 A1* | 11/2011 | Memon | .................. | H01L 23/427 |
| | | | | 361/679.47 |
| 2012/0320531 A1* | 12/2012 | Hashimoto | ........ | H05K 7/20854 |
| | | | | 361/720 |
| 2013/0013126 A1* | 1/2013 | Salsbery | .................. | G06F 1/203 |
| | | | | 700/299 |
| 2013/0082517 A1* | 4/2013 | Kawai | ................... | B60R 16/033 |
| | | | | 307/9.1 |
| 2013/0202936 A1* | 8/2013 | Kosaki | ................... | H01G 9/155 |
| | | | | 429/99 |
| 2014/0239904 A1 | 8/2014 | Tanaka et al. | | |
| 2015/0037616 A1* | 2/2015 | Wyatt | ................. | H01M 10/625 |
| | | | | 429/7 |
| 2015/0072188 A1* | 3/2015 | Dulle | ..................... | B60R 16/03 |
| | | | | 429/61 |
| 2015/0131230 A1* | 5/2015 | Chien | ................... | H01L 23/367 |
| | | | | 361/707 |
| 2015/0214531 A1* | 7/2015 | Sun | ..................... | H01M 2/1077 |
| | | | | 429/120 |
| 2016/0006911 A1* | 1/2016 | Kimura | ............... | H04N 5/2252 |
| | | | | 348/47 |
| 2016/0036029 A1* | 2/2016 | Tononishi | .......... | H01M 2/1077 |
| | | | | 429/121 |
| 2016/0118366 A1* | 4/2016 | Jang | ..................... | H01L 23/367 |
| | | | | 257/773 |
| 2017/0133298 A1* | 5/2017 | Gutala | ................ | H01L 23/3677 |
| 2017/0341607 A1* | 11/2017 | Sumida | ............... | B60R 16/0239 |
| 2018/0136151 A1* | 5/2018 | Uraki | ..................... | G01N 25/20 |

* cited by examiner

BATTERY PACK

CROSS-REFERENCE TO RELATED APPLICATION

This application is based on and claims the benefit of priority from earlier Japanese Patent Application No. 2016-242329 filed Dec. 14, 2016, the description of which is incorporated herein by references.

TECHNICAL FIELD

A disclosure in this specification relates to a battery pack accommodating batteries therein.

BACKGROUND

Japanese Patent Application Laid-Open Publication No. 2014-13722 (Patent Document 1) discloses a battery pack that accommodates a battery.

An accommodating case has a bottom plate portion and a rising wall portions rising from the bottom plate portion.

The bottom plate portion is a module mounting portion on which an assembled battery module is placed, and in a state in which the assembled battery module is mounted on the bottom plate portion, the assembled battery module is surrounded by the rising wall portions.

The accommodating case is composed of a base and a cover. The assembled battery module and a control board are disposed vertically opposed to each other so that the assembled battery module is at the bottom and the control board is at the top, and the assembled battery module and the control board are fixed to the base.

The base is provided with heat dissipation means for dissipating heat generated in the assembled battery module and the control board to the outside.

In this heat dissipating means, ribs for dissipating heat are disposed on a lower surface side of the bottom plate portion.

In this case, the heat generated in the assembled battery module and the control board is transferred to the bottom plate portion via the rising wall portions, and is released from the ribs of the bottom plate portion to the outside of the unit.

Further, a heat dissipating portion for a power element is disposed on an upper surface side of the bottom plate portion so as to be opposed to a back surface side of the control board.

The heat dissipating portion is an opposing plate portion of which an upper surface is opposed to the control board, and a plurality of dissipating fins are disposed on a lower surface side of the opposing plate portion.

The heat dissipating portion is disposed on the control board so as to face a mounted portion of the power element, and the heat generated by the power element is transferred to the opposing plate portion, and further released from the fins to the outside of the unit.

Flanges are disposed on the bottom plate portion outside the rising wall portions. The flanges are fixed to vehicle-side members by bolts or the like for fixing the unit.

These flanges function as parts of heat dissipation paths when the heat of the power element or the like installed on the control board is dissipated to the vehicle-side members via the opposing plate portion.

Contents of the prior art document enumerated as prior art are incorporated by reference as an explanation of technical elements in the present specification.

In the battery pack of Patent Document 1, sufficient regularity cannot be found for obtaining heat dissipation property with respect to a positional relationship and the distance between a heat generating element such as the power element and the flanges fixed to the vehicle-side members.

For example, when there exists a second electrical component having a smaller heating value than a first electrical component having a larger heating value in the middle of the heat dissipation path leading from the first electrical component to the flanges, not only the heat dissipation of the second electrical component is affected but also the second electrical component may be thermally influenced For this reason, there is a problem that the heat generation of the electrical components cannot be efficiently dissipated to the vehicle-side members.

SUMMARY

An embodiment provides a battery pack capable of improving heat dissipation performance from an electrical component to a vehicle-side member to which a base of a casing is fixed.

A plurality of embodiments disclosed in the present specification adopt different technical means with the same overall concept in order to achieve their respective objectives.

In a battery pack according to a first aspect, the battery pack includes a secondary battery, a casing for accommodating the secondary battery, a base which is a part of the casing and has a heat dissipation wall and a side wall disposed so as to be capable of transferring heat to the heat dissipation wall, a fixing portion disposed on the side wall in the base and fixed to a vehicle-side member, and an electrical component disposed so that released heat can be transferred to the heat dissipation wall or the side wall.

The electrical component includes a first electrical component and a second electrical component having a smaller heating value than the first electrical component has, and the first electrical component is disposed at a position closer to the fixing portion than the second electrical component is in planar view.

According to the battery pack, by a configuration of disposing the first electrical component having a larger heating value than that of the second electrical component at a position closer to the fixing portion than the second electrical component is in planar view, it is possible to realize a positional relationship in which the second electrical component is not disposed in heat dissipation paths from the first electrical component to the fixing portion.

Because of the positional relationship, heat is dissipated from the first electrical component to the fixing portion in a configuration difficult to give a heat effect to the second electrical component, so that heat dissipation from the first electrical component to the vehicle-side member is not inhibited, and heat dissipation to suppress the heat load from transferring from the first electrical component to the second electrical component can be performed.

Therefore, it is possible to provide a battery pack capable of improving heat dissipation performance from an electrical component to a vehicle-side member to which a base of a casing is fixed.

DETAILED DESCRIPTION OF THE PREFERRED EMBODIMENTS

Figure 1:
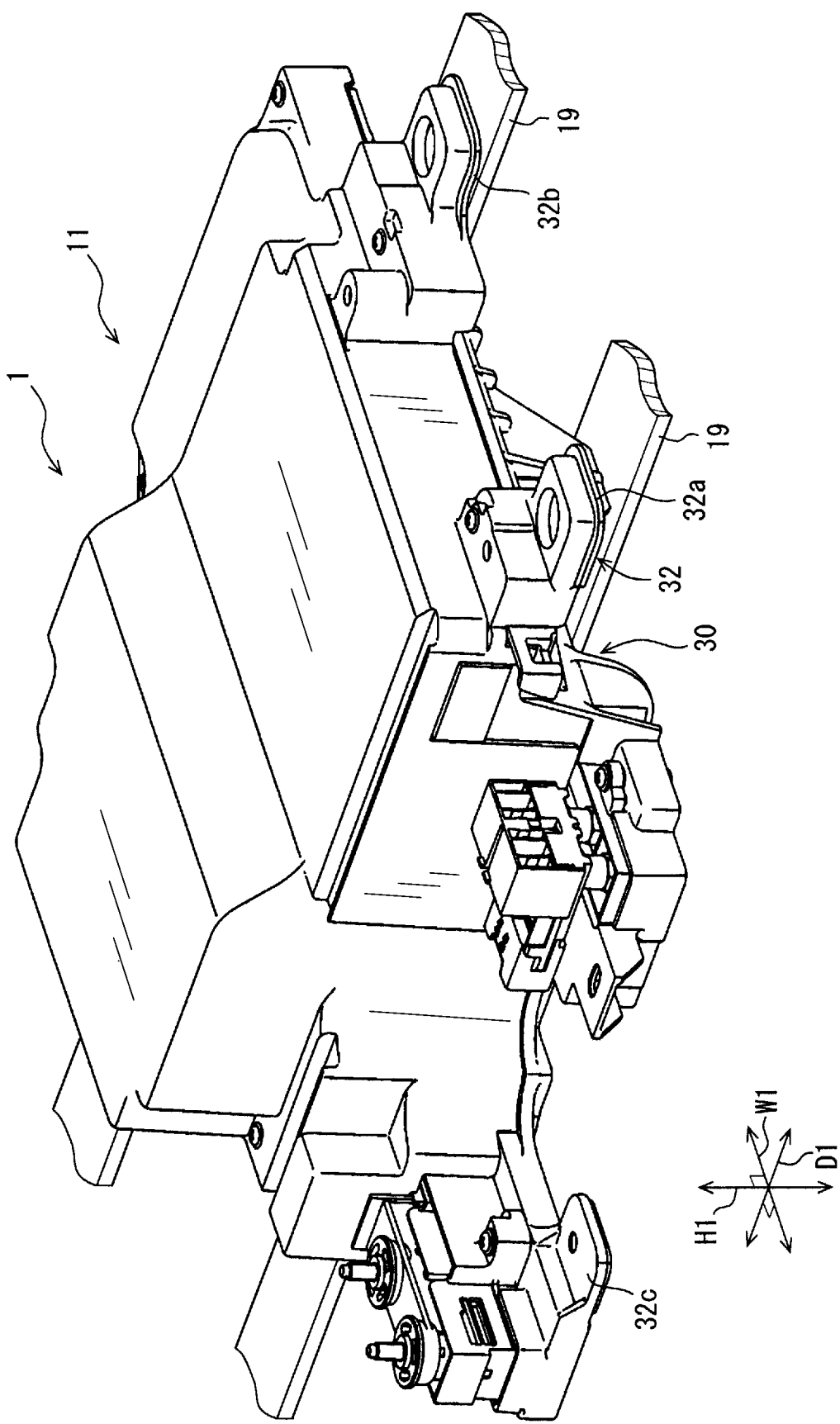
FIG. 1 shows a perspective view of a battery pack according to a first embodiment.

Hereinafter, a plurality of embodiments for implementing the present disclosure will be described with reference to the drawings.

In each of the embodiments, portions corresponding to items described in the preceding embodiment are given the same reference numerals, and redundant explanation may be omitted.

In a case where only a part of a configuration is described in each of the embodiments, the other embodiments described before can be applied to other parts of the configuration.

Not only combinations of parts that are clearly indicated as possible in each embodiment, but also partial combination of embodiments, may be performed as long as there is no particular obstacle to the combinations.

First Embodiment

A battery pack 1 of a first embodiment will be described with reference to FIGS. 1 to 8.

In each drawing, a vertical direction or a height direction H1, a width direction W1, and a depth direction D1 are shown.

In the battery pack 1 of the present embodiment, as one of the installation examples, the height direction H1 is the vertical direction.

The width direction W1 and the depth direction D1 are also lateral directions orthogonal to the height direction H1.

The battery pack 1 can be applied to a vehicle on which a plurality of unit cells 21 (batteries) are mounted. An example of a vehicle is an automobile. The battery pack 1 is mounted, for example, under a seat of the automobile.

The battery pack 1 is disposed in a space between a front seat and a floor, a space between a rear seat and the floor, a space between a rear seat and a trunk (a storage place), a space between a driver's seat and a passenger seat, and the like of the automobile.

The vehicle is, for example, a hybrid vehicle using the battery pack 1 as a traveling drive source by combining an internal combustion engine and a battery-driven motor, an electric vehicle traveling with a battery-driven motor, or the like. An example in which the battery pack 1 is mounted on a hybrid vehicle will be described in the present embodiment.

The battery pack 1 in the present embodiment is installed such that, for example, the width direction W1 matches with a width direction of the vehicle.

In this case, the width direction W1 of the battery pack 1 corresponds to a collision load direction at the time of a side collision in which an impact is applied to a side portion of the vehicle from the outside.

The battery pack 1 includes a cover 11 and a base 30 as shown in FIG. 1. A part of a casing having at least the cover 11 and the base 30 is fixed to vehicle-side members 19 in the battery pack 1.

The cover 11 and the base 30 form an outer shell of the battery pack 1 and constitute a housing of the battery pack 1. The cover 11 and the base 30 form a casing for accommodating functional parts.

The cover 11 is made of resin. The cover 11 constitutes an outer shell of an upper portion or a ceiling portion of the battery pack 1. The base 30 constitutes an outer shell of a lower portion or a bottom portion of the battery pack 1.

Figure 2:
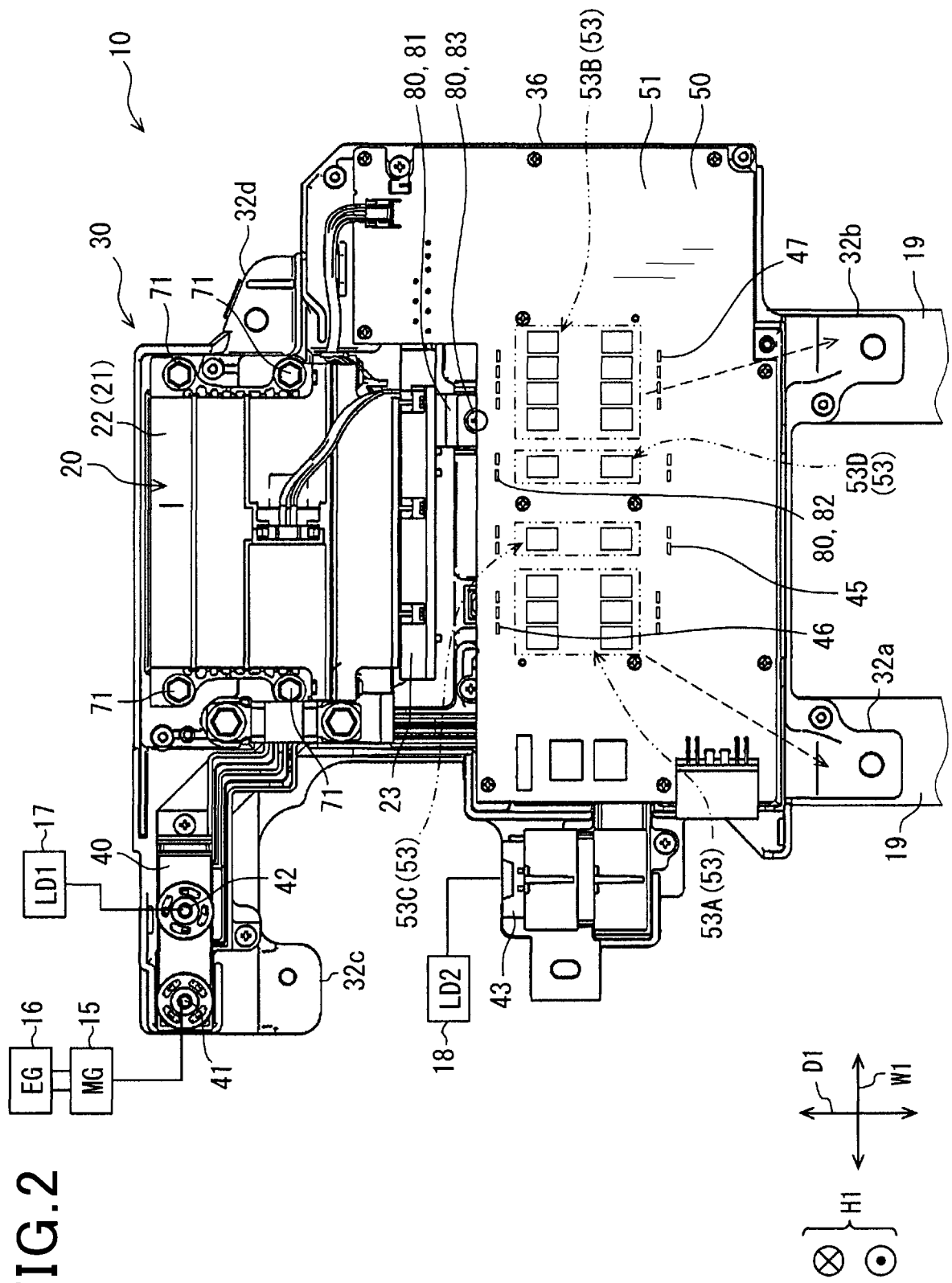
FIG. 2 shows a planar view of the battery pack in a state where a cover is removed according to the first embodiment.

FIG. 2 shows the battery pack 1 with the cover 11 removed.

The battery pack 1 cooperates with a generator motor (MG) 15 of the vehicle. The battery pack 1 provides a motorized system of a vehicle. The generator motor 15 is connected to an internal combustion engine (EG) 16.

The battery pack 1 is connected to an electric load (LD1) 17 and another electric load (LD2) 18 in the vehicle. The electric load 17 is an electric load through which a large current flows, such as a battery and a starter. The other electric load 18 is a part or the whole of a plurality of electric loads of the vehicle except the battery and the starter.

The generator motor 15 functions as a generator by being driven by the internal combustion engine 16. At least a part of the electric power generated by the generator motor 15 is supplied to the battery pack 1, whereby the battery pack 1 is charged.

The generator motor 15 also functions as an electric motor when electric power is supplied from the battery pack 1 to the generator motor 15. The generator motor 15 functions as a power source together with the internal combustion engine 16.

The generator motor 15 supplies the power that exceeds the power supplied by the internal combustion engine 16 or the power that assists the power supplied from the internal combustion engine 16, for example.

The battery pack 1 includes a battery unit 20, the base 30, a bus bar unit 40, and an electrical circuit 50. The battery unit 20, the bus bar unit 40, and the electrical circuit 50 are mounted on the base 30. The electrical circuit 50 is a functional part including a substrate 51 and a plurality of electrical components 52. The base 30 has a concave container portion 31 for installing the battery unit 20.

In the base 30, only a part (for example, a lower portion) of the battery unit 20 is accommodated in the container portion 31, and the remaining part (for example, an upper part) of the battery unit 20 protrudes from the base 30.

The battery unit 20, the bus bar unit 40, and the electrical circuit 50 are attached to the base 30 along the height direction H1 which is an assembling direction thereof.

The battery unit 20, the bus bar unit 40, and the electrical circuit 50 are fixed to the base 30 by fastening members such as a plurality of screws or bolts.

The battery pack 1 has conductive connecting members 80 for electrically connecting the battery unit 20 and the electrical circuit 50.

The battery unit 20 has main terminals. The main terminals provide output lines which are subject to switching operation. The main terminals are positive terminals as the battery unit 20. The connecting members 80 are conductive members for connecting the positive terminals and the electrical circuit 50.

The connecting members 80 are provided by a bus bar which is a metal plate having a predetermined shape in the present embodiment.

In a manufacturing method of the battery pack 1, the bus bar is manufactured by cutting a metal plate into a predetermined shape and bending it into a predetermined shape, or the like. The connecting members 80 has a first bus bar 81 connected to the battery unit 20 and a second bus bar 82 connected to the electrical circuit 50. The connecting members 80 have a fixing member 83 such as a bolt for fastening the first bus bar 81 and the second bus bar 82.

The first bus bar 81 is electrically connected by being fixed to the total plus terminals of the plurality of unit cells 21 included in the battery unit 20 by fixing means.

The first bus bar 81 has an opening portion for receiving the fixing member 83. The first bus bar 81 has a shape protruding from the battery unit 20 toward the substrate 51 along the depth direction D1.

The fixing member 83 fastens the first bus bar 81 along the height direction T1. The fixing member 83 also fastens the second bus bar 82 along the height direction T1.

The second bus bar 82 extends from a tightening position to a lower side of the substrate 51 and extends toward the substrate 51. The second bus bar 82 has a plurality of terminals penetrating through the substrate 51. The second bus bar 82 is electrically connected to the electrical circuit 50 by being fixed by fixing means.

The fixing means is a solder. The fixing means can also be provided by various means such as welding, or tightening with bolts.

The second bus bar 82 has a plurality of terminal portions for being connected to the electrical circuit 50. The second bus bar 82 has an opening portion for receiving the fixing member 83.

The battery unit 20 has a battery case 22 that accommodates the plurality of unit cells 21. The battery case 22 is made of electrically insulating resin. The battery case 22 is a part of a container that accommodates the plurality of unit cells 21.

The battery case 22 fixes the plurality of unit cells 21 to each other. Further, the battery case 22 is also a fixing member for fixing the plurality of unit cells 21 to the base 30.

The battery case 22 has a plurality of brackets for fixing the battery unit 20 to the base 30. The battery case 22 has a plurality of ribs to increase the strength of walls and/or to reduce gaps between the battery case 22 and the base 30.

The battery unit 20 has a monitor module 23. The monitor module 23 has an electrically insulating resin member 24 and monitor connecting members 25 connected to the plurality of unit cells 21.

The monitor connecting member 25 is embedded in the resin member 24 by insert molding. The monitor connecting member 25 passes through the resin member 24 to connect the unit cells 21 and the electrical circuit 50.

The monitor module 23 has a water sensor having a plurality of water detection electrodes. The monitor module 23 is disposed along one surface of the battery case 22 which is a hexahedron. The monitor module 23 is also a lid of the battery case 22.

The base 30 is made of a conductive metal. The base 30 is also called a carrier. The base 30 can be formed by, for example, aluminum-die casting. The base 30 has high thermal conductivity as well as high rigidity. The base 30 includes the container portion 31 for accommodating the battery unit 20.

The base 30 has a plurality of stays 32a, 32b, 32c, 32d. The plurality of stays 32a, 32b, 32c, 32d are collectively referred to as the stays 32. The stays 32 are fixing parts fixed to the vehicle-side members 19 in order to fix the battery pack 1 to the vehicle.

The vehicle-side members 19 are parts of a vehicle to which the battery pack 1 is attached for fixing the battery pack 1, and is, for example, a plate-like frame or a panel.

The stays 32 are provided with mounting holes for inserting bolts or the like as an example of fixing means for fixing the stays 32 to the vehicle-side members 19. The stays 32 may be fixed to the vehicle-side members 19 by fixing means such as welding.

Figure 4:
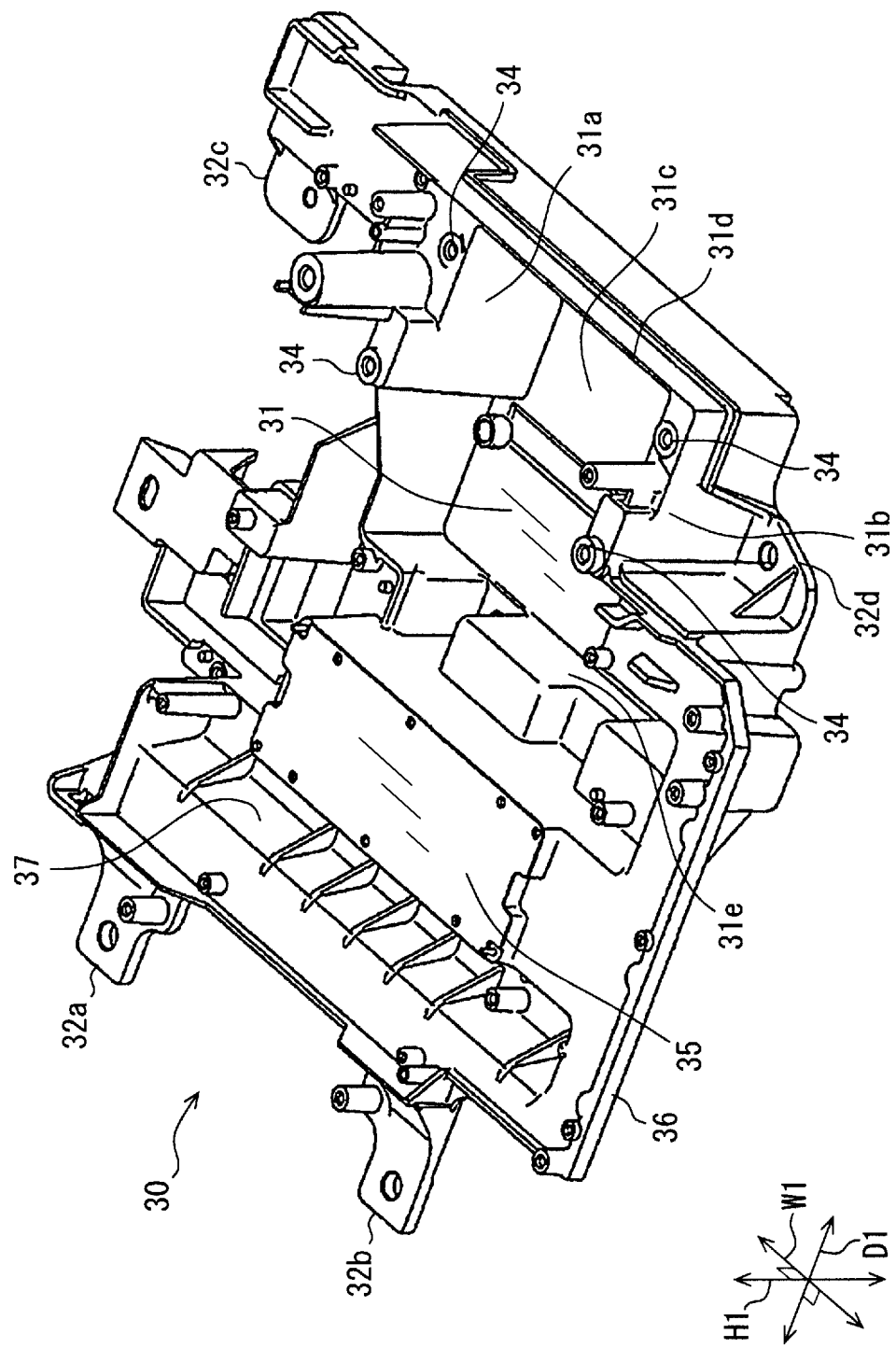
FIG. 4 shows a perspective view of a base of the battery pack according to the first embodiment.
Figure 5:
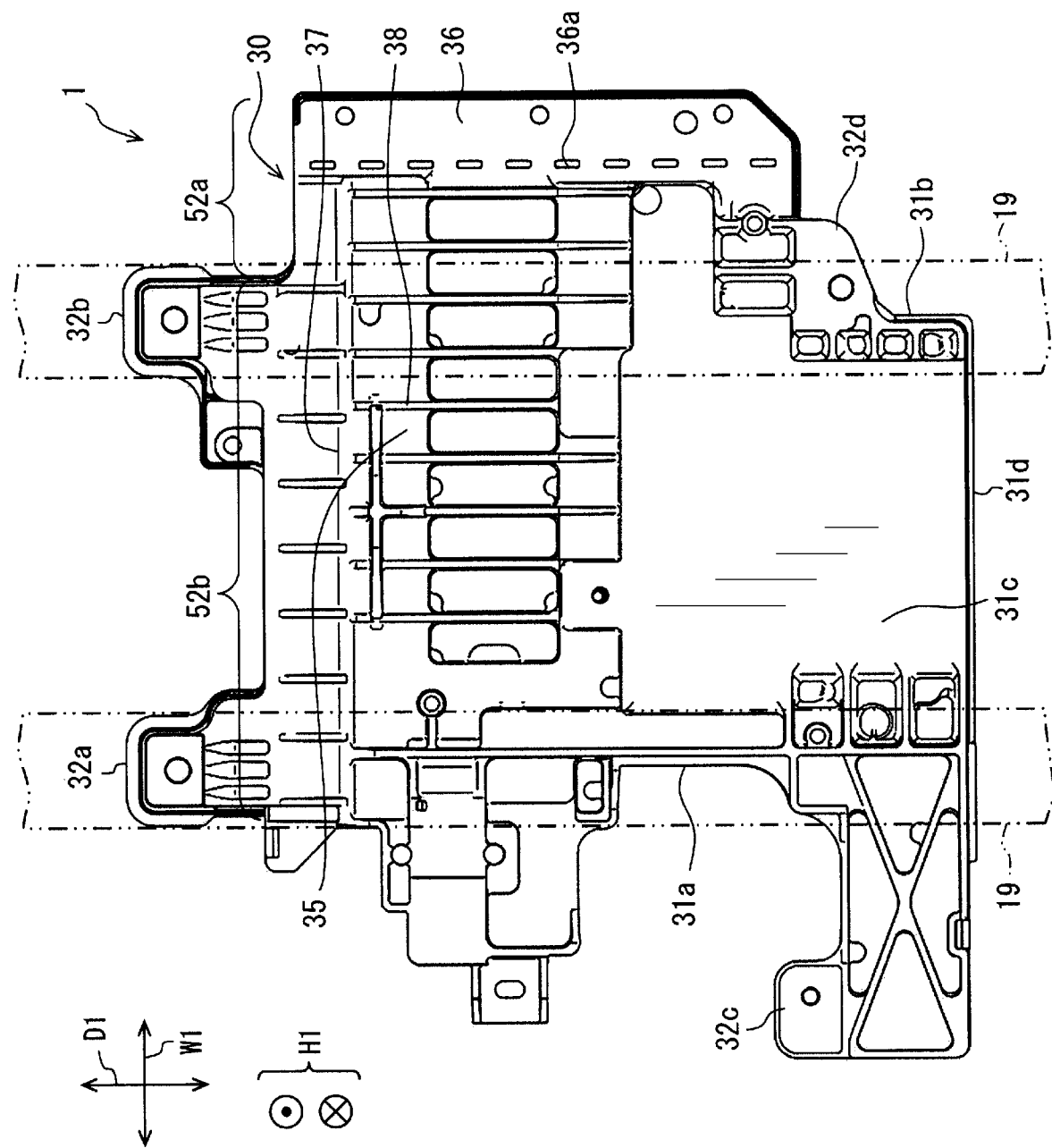
FIG. 5 shows a bottom view showing a positional relationship between a lower surface side of the base and vehicle-side members of the battery pack according to the first embodiment.
Figure 6:
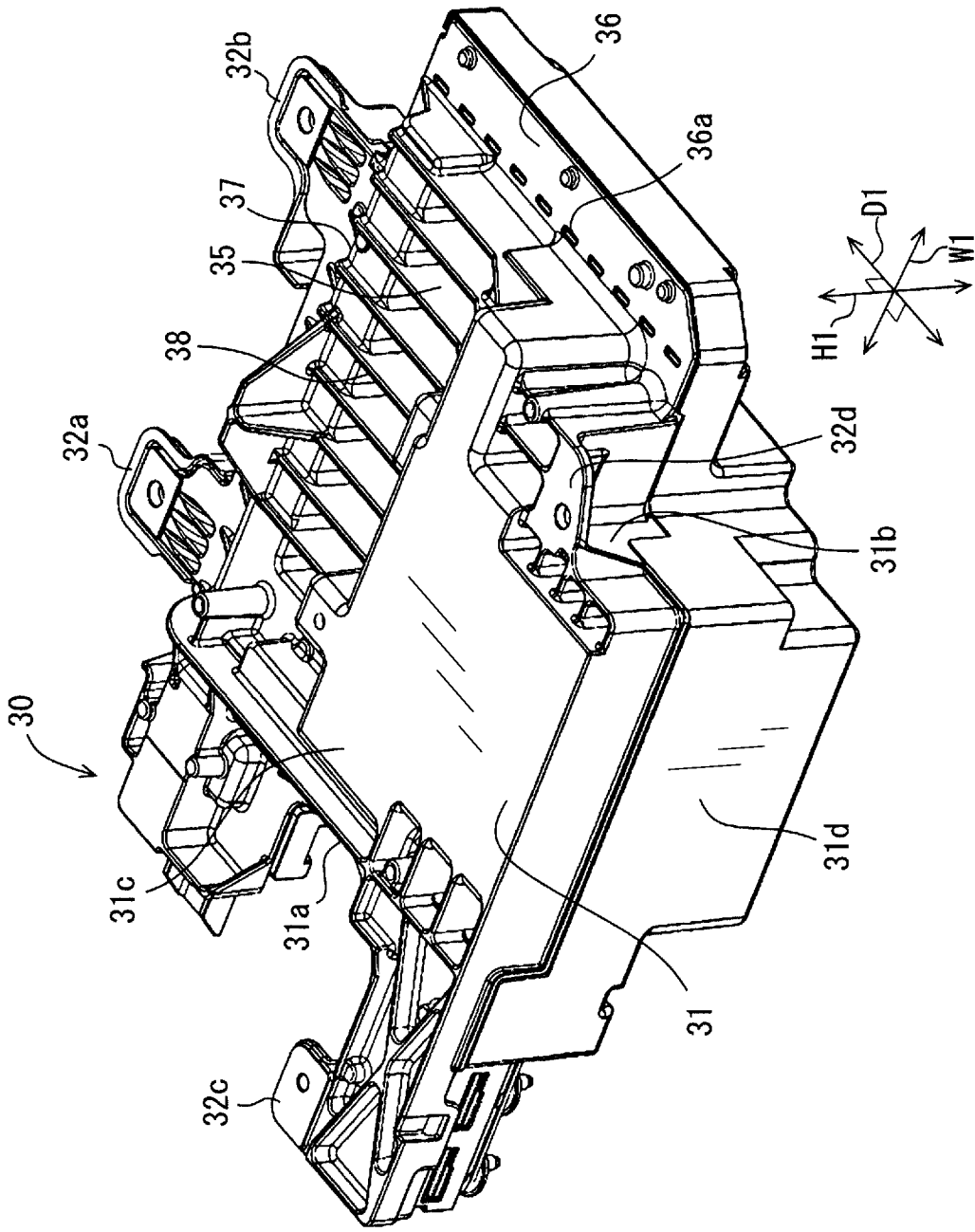
FIG. 6 is a perspective view showing the lower surface side of the base in the battery pack according to the first embodiment.

As shown in FIGS. 4 to 6, the base 30, which is a part of the casing, includes thin wall portions 36a disposed in a widthwise end portion 36 existing at a position protruding outward from the unit cell 21 and the stays 32.

The widthwise end portion 36 is a portion located outside the container portion 31 and a heat dissipation wall 35 in the base 30, and is a portion where a low power section 52a of the substrate 51 is installed.

The thin wall portions 36a are fragile portions having lower rigidity than the surroundings, and are constituted by groove portions recessed in a rectangular section from the lower surface side of the base 30 opposed to the substrate 51.

The thin wall portions 36a are constituted by a plurality of grooves disposed so as to be arranged in line over the entire length in the longitudinal direction of the vehicle at the widthwise end portion 36.

With this configuration, the base 30 is provided with the fragile portions over the entire length in the longitudinal direction of the vehicle at the widthwise end portion 36, so that when the external force acts, the widthwise end portion 36 over the entire length in the longitudinal direction of the vehicle is easily broken.

The thin wall portions 36a are the portions constituted by the groove portions recessed from a lower surface toward an upper surface of the widthwise end portion 36 placed on the substrate 51.

The thin wall portions 36a are thinner than the surrounding portions by the depth of the recess forming the groove portion.

Further, the thin wall portions 36a may be portions constituted by groove portions recessed from the upper surface to the lower surface of the widthwise end portion 36.

The plurality of grooves may be provided so as to form a plurality of rows arranged in the width direction W1 of the vehicle.

The widthwise end portion 36 is disposed at an end portion of the battery pack 1 in the width direction W1 of the vehicle. The widthwise end portion 36 is a plate-like portion located in the base 30 near a side portion of a vehicle outer shell.

The widthwise end portion 36 is disposed in the base 30 so as to have a positional relationship in which it faces the side portion of the vehicle outer shell such as a door portion.

Therefore, when an impact is applied to the side portion of the vehicle, for example, when some object collides with the side portion of the vehicle, an external force acts on the widthwise end portion 36 of the base 30 as the side portion of the vehicle outer shell is recessed inward.

The thin wall portions 36a are fragile portions configured to have strength such that they are more easily deformed by the external force than the portions surrounding the base 30.

The thin wall portions 36a constitutes a portion having a smaller thickness than the portion around the base 30 and corresponds to a portion having low rigidity in the widthwise end portion 36.

The thin wall portions 36a are disposed at positions protruding from the unit cell 21 in a direction intersecting with a direction in which the stays 32b, which are the fixing portions to the vehicle-side members 19, protrudes with respect to the unit cell 21.

The thin wall portions 36a are disposed at positions protruding toward the side of the vehicle outer shell more than the unit cell 21 is in the width direction W1 of the vehicle; the width direction W1 intersects the longitudinal direction of the vehicle in which the stay 32b is protruding with respect to the unit cell 21.

The thin wall portions 36a are provided at positions protruding outward in the width direction W1 of the vehicle by more than the unit cell 21 and the stays 32b, 32d are, and are present at positions closer to the side portion of the vehicle than the unit cell 21 and the stays 32b, 32d are.

The stays 32b, 32d are disposed at positions protruding further in the longitudinal direction of the vehicle than the thin wall portions 36a are.

The thin wall portions 36a are disposed at positions protruding in the width direction W1 of the vehicle more than the vehicle members 19 are to which the stay 32b is fixed, and are present at positions closer to the side portion of the vehicle than the vehicle-side members 19 are.

The bus bar unit 40 provides power paths extending from power terminals of the battery unit 20. The bus bar unit 40 has electrically insulating resin members and power connecting members connected to the battery unit 20.

The bus bar unit 40 is fixed on the base 30. The bus bar unit 40 has a power terminal 41, a power terminal 42, and a power terminal 43. The bus bar unit 40 has at least two power connecting members.

One power connection member is disposed between one power terminal and another power terminal of the battery unit 20 to provide an electrical connection.

The power terminal 41 located outside the power terminal 42 is connected to the generator motor 15. The power terminal 42 located inside the power terminal 41 is connected to the electric load 17. The power terminal 43 is connected to the electric load 18.

The bus bar unit 40 is also a member for connecting the plurality of power terminals 41, 42, 43, the battery unit 20 and the electrical circuit 50.

The electrical circuit 50 is fixed on the base 30. The electrical circuit 50 is disposed so as to spread to the side of the battery unit 20. The electrical circuit 50 has such a size and shape as to spread across a side of one face of the battery unit 20 and a side of another face of the battery unit 20.

The battery unit 20 is installed at one corner of the base 30 having a substantially quadrilateral shape. The electrical circuit 50 occupies a range extending over the base 30 in a hook shape or an L shape spreading to the sides of the battery unit 20.

The electrical circuit 50 is installed along the monitor module 23. A part of the electrical circuit 50 is installed in a range spreading to the side of the monitor module 23 side of the battery unit 20.

Another part of the electrical circuit 50 is installed beside the battery unit 20 so as to spread to the side of a peripheral surface of the monitor module 23.

The electrical circuit 50 has the substrate 51 and the plurality of electrical components 52. The substrate 51 is a printed circuit board provided with a wiring pattern.

The substrate 51 is a flat plate which can be referred to as an L shape or a hook shape. The substrate 51 spreads over a horizontal range occupied by the electrical circuit 50. The substrate 51 is placed on the heat dissipation wall 35 provided on the base 30.

The substrate 51 and the heat dissipation wall 35 are disposed in direct contact with each other, or indirectly via a heat conductive member such as a sheet or gel having excellent thermal conductivity in a thermal contact state so that heat can be transferred from the substrate 51 to the heat dissipation wall 35.

The heat dissipation wall 35 and the stays 32 are integrally formed so as to be thermally movable through other parts of the base 30.

Therefore, a heat dissipation path through which the heat transferred from the substrate 51 to the heat dissipating wall 35 dissipates to the vehicle-side members 19 through the stays 32 provided on a first side wall 37 is constructed.

As shown in FIG. 5, the base 30 has at least one rib 38 connecting at least the heat dissipation wall 35 and the first side wall 37. The rib 38 has a surface extending along a direction of the shortest distance connecting the heat dissipation wall 35 and the first side wall 37.

The rib 38 is a plate-like wall protruding from the heat dissipation wall 35 on the lower surface side of the base 30. One end of the rib 38 protrudes from the heat dissipation wall 35, and one end thereof protrudes from the first side wall 37.

A plurality of ribs 38 are arranged in a direction intersecting a direction of the shortest distance connecting the heat dissipation wall 35 and the first side wall 37.

As shown in FIG. 5, the plurality of ribs 38 are arranged over a length equal to or greater than a lateral width of the heat dissipation wall 35.

The plurality of ribs 38 are disposed over both a high power section 52b and the low power section 52a in a state where the base 30 is viewed from the bottom.

The plurality of ribs 38 are disposed over a length equal to or greater than the lateral width of the heat dissipation wall 35.

The plurality of ribs 38 are disposed in a direction crossing or orthogonal to a direction in which the stays 32a and 32b protrude toward the first side wall 37.

Tips of the ribs 38 are located at a height closer to the stay 32 than a bottom wall 31c of the container portion 31 is. The tips of the ribs 38 are located above the bottom wall 31c and are positioned closer to the stays 32.

The ribs 38 are plate-shaped walls extending along the plurality of thin wall portions 36a, and are connecting the heat dissipation wall 35 and the first sidewall 37.

The stays 32 may be provided so as to protrude from the first side wall 37 and a second side wall provided so as to face each other, respectively, or protrude from the first side wall 37 and the second side wall, respectively.

In this case, the ribs 38 are walls connecting the first side wall 37 and the second side wall.

According to the ribs 38, the heat generated by switching devices 53, which are the electrical components 52, moves to the heat dissipation wall 35 via the lower substrate 51, moves downward from the heat dissipation wall 35 along the first side wall 37, and can be moved from the heat dissipation wall 35 to the first side wall 37 through the ribs 38.

Further, the heat is transmitted from the first side wall 37 to the vehicle-side members 19 via the stays 32 at the lower side and is discharged to the outside.

According to this heat dissipation path, a path by which the heat is transmitted from the heat dissipation wall 35 to the first side wall 37 along the heat dissipation wall 35 and a path of which moves downward from the heat dissipation wall 35 and is transmitted to the first side wall 37 via the rib 38 can be constituted.

Therefore, according to the battery pack 1, it is possible to constitute a heat transfer path that transmits the heat to a solid having a thermal conductivity higher than that of air as a heat dissipation path of heat generating elements.

The substrate 51 is a single substrate. The plurality of electrical components 52 are arranged on the substrate 51. The electrical components 52 are elements that generate heat in the battery pack 1, and correspond to the heat generating elements.

The substrate 51 has a plurality of connecting portions. A part or all of the plurality of connecting portions provide connection between the power connecting members of the bus bar unit 40 and the electrical components 52.

The electrical circuit 50 is connected to the plurality of unit cells 21. The plurality of electrical components 52 provide a control unit 100.

A control device monitors the voltage of each of the plurality of unit cells 21 included in the battery unit 20. The control device monitors the charging state and the discharging state of each of the plurality of unit cells 21. The control device appropriately controls the charging state of each of the plurality of unit cells 21.

The unit cell 21 is, for example, a nickel hydrogen secondary battery, a lithium ion battery, or an organic radical battery.

The plurality of electrical components 52 include one or a plurality of switch devices 53. The switch device 53 is a device that is on/off controlled by the electrical circuit 50. The switch device 53 can intermittently control the output of the battery unit 20.

The switch device 53 intermittently interrupts the current supplied from the total plus terminal of the battery unit 20. The switch device 53 is mounted on the substrate 51. The switch device 53 is a semiconductor switch widely known as a transistor, MOS, IGBT or the like.

In addition, the switch device 53 may be configured to be supported while being separated from the substrate 51. Further, the switch device 53 may be a mechanical relay electromagnetically opened and closed.

The switch device 53 is one of the electrical components 52 that generates heat in the battery pack 1, and corresponds to a heat generating element.

In addition to the switch device 53, a resistor may be included in the electrical components which is a heat generating element.

The connecting members 80 electrically connect the positive terminals and the switching devices 53.

The connecting members 80 provide at least parts of the conductive members between the positive terminals and the switching devices 53.

The connecting members 80 are disposed in the vicinity of the battery unit 20 on the substrate.

The connecting members 80 are disposed on edges of the substrate 51 closest to the battery unit 20.

The connection members 80 are connected at portions of the substrate 51 closest to main terminals of the battery unit 20.

A plurality of terminals for the connecting members 80 are arranged on the substrate 51 along the battery unit 20.

The switching devices 53 are disposed close to such connection members 80.

Water may infiltrate into the battery pack 1 when water is spilled on the seat, when a wet occupant uses a seat, or when the vehicle is immersed in water.

In this case, the battery pack 1 sometimes discharges via water as a discharge path.

In the present embodiment, the battery pack 1 is provided with a water sensor for detecting water in the battery pack 1 and the control device for executing countermeasure processing when water is detected.

The control device monitors flooding of the battery pack 1. The control device performs countermeasure processing when flooding is detected.

The countermeasure processing is, for example, to turn off a breaker element which is one of the plurality of electrical components.

The control system provided by the electrical circuit 50 provides a control device which is an electronic control unit. The control device has at least one central processing unit (CPU) and at least one memory device (MMR) as a storage medium for storing programs and data.

The control device is provided by a microcomputer including a computer-readable storage medium. The storage medium is a non-transitory physical storage medium that temporarily stores the computer-readable program.

The storage medium may be provided by a semiconductor memory, a magnetic disk, or the like.

The control device may be provided by a set of computer resources linked by a computer or data communication device. The program is executed by the control device so that the control device functions as the device described in this specification and causes the control device to perform the method described in this specification.

The control system has, as input devices, a plurality of signal sources for supplying signals indicative of information input to the control device. In the control system, the control device acquires information by storing the information in the memory device.

The control system has a plurality of controlled objects of which operations are controlled by the control device as output devices. The control system converts the information stored in the memory device into a signal and supplies it to the controlled object, thereby controlling the operation of the controlled object.

The control device, the signal source and the controlled object included in the control system provide various elements. At least parts of these elements may be referred to as blocks for performing functions.

In another aspect, at least parts of these elements may be referred to as modules or sections that are interpreted as a configuration. Furthermore, the elements included in the control system may also be referred to as means for enabling the function when in an intentional case.

Means and/or functions provided by the control system may be provided by software recorded in a substantive memory device and the computer executing it, software only, hardware only, or a combination thereof.

For example, if the control device is provided by an electronic circuit which is hardware, it can be provided by digital circuitry including a number of logic circuits, or analog circuitry.

The electrical circuit 50 may include a circuit as an inverter and/or a converter, and a monitor circuit for monitoring voltages of the plurality of unit cells 21.

Figure 3:
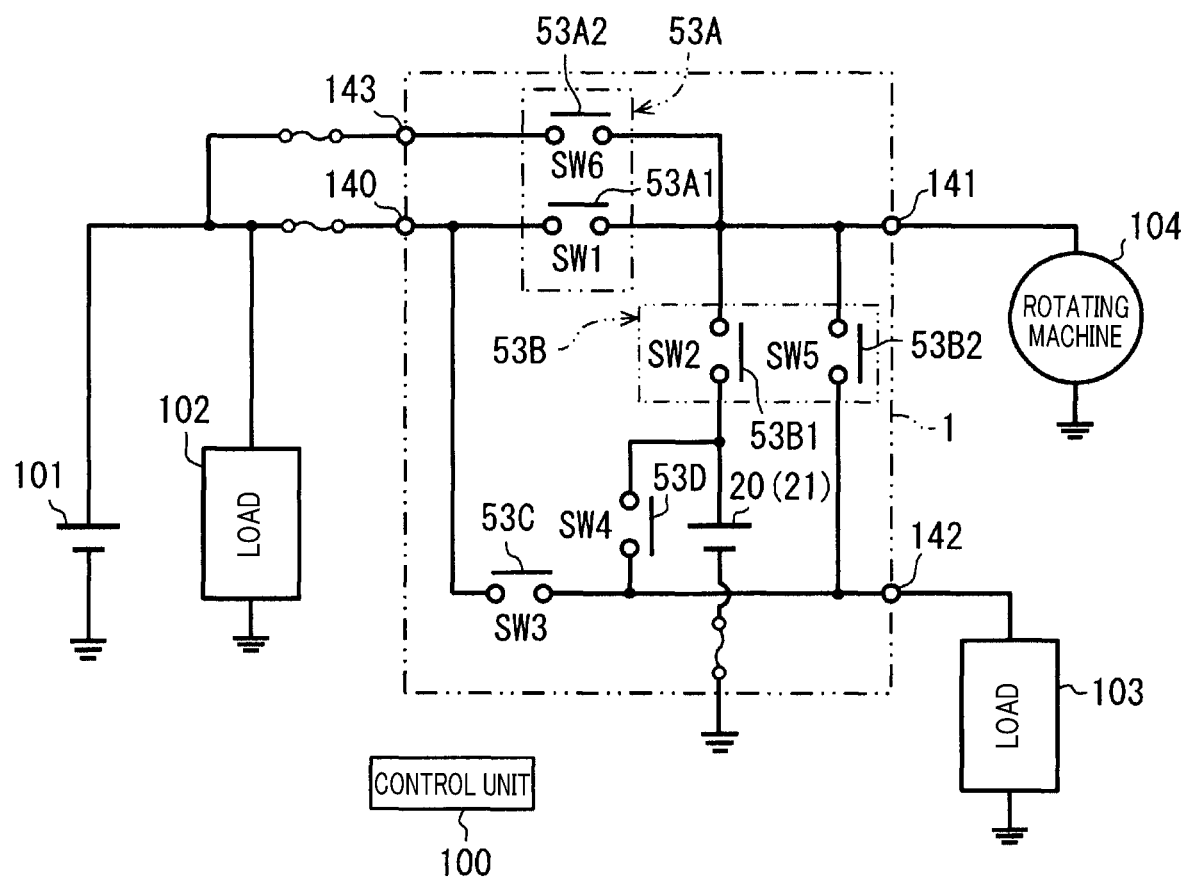
FIG. 3 shows a circuit diagram related to the battery pack according to the first embodiment.

As shown in FIG. 3, a circuit related to the battery pack includes an external battery 101, the battery unit 20, a rotating machine 104, an electric load 102, another electric load 103, a first switching device 53A, a second switching device 53B, a third switching device 53C, a fourth switching device 53D, the control unit 100, and the like.

The external battery 101 is a secondary battery installed outside the casing that accommodates the battery unit 20, and is constituted of a lead storage battery, for example.

The external battery 101 is disposed in a separate location apart from the battery pack 1 including the internal battery, and it is preferably a large capacity secondary battery.

Components constituting the control unit 100 are mounted on the substrate 51. The control unit 100 performs switching between ON (closing) and OFF (opening) of each switching device 53 as each power element, thereby controlling charging and discharging of each of the external battery 101 and the battery unit 20.

A first input/output terminal 140, a second input/output terminal 141, a third input/output terminal 142, and a fourth input/output terminal 143 are provided in the battery pack 1 as external terminals.

The external battery 101 and the electric load 102 are connected in parallel to the first input/output terminal 140, and a first switching device 53A1 and the second input/output terminal 141 are connected in series to a side opposite to the external battery 101.

Further, the external battery 101 is connected so as to be capable of supplying electric power to the electric load 102.

The electric load 102 is a general electrical load other than a constant voltage requesting electrical load, such as a headlight, wipers of a front windshield, a blower fan of an air conditioner, a heater for a defroster of a rear windshield, and the like.

The external battery 101 is connected in series to the fourth input/output terminal 143, and another first switching device 53A2 is connected in series to a side opposite to the external battery 101.

The first switching device 53A1 and the first switching device 53A2 are in a parallel relationship and constitute the first switching device 53A that performs current control on a line between the rotating machine 104 and the external battery 101.

The first switching device 53A1 and the first switching device 53A2 are semiconductor switches such as MOSs through which a large current flows.

The first switching device 53A is a switching device that has the largest instantaneous current among the switching devices 53 of the battery pack 1.

The first switching device 53A2 is connected to a line between the first switching device 53A1 and the second input/output terminal 141 on a side opposite to the fourth input/output terminal 143.

A second switching device 53B1 and the battery unit 20 are further connected in series to this connection part.

Another second switching device 53B2 is connected to a line between the connection part and the second input/output terminal 141.

The second switching device 53B2 is connected to the third input/output terminal 142 on a side opposite to the second input/output terminal 141.

The second switching device 53B1 and the second switching device 53B2 are in a parallel relationship and constitute the second switching device 53B which performs current control in a line between the rotating machine 104 and the battery unit 20.

The second switching device 53B1 and the second switching device 53B2 are system main relays in which a large current flows similarly to the first switching device 53A.

The second switching device 53B is a switching device with the largest steady current among the switching devices 53 of the battery pack 1.

The rotary machine 104 is connected to the second input/output terminal 141 on a side opposite to the first switching device 53A.

The first switching device 53A and the second switching device 53B are connected in parallel to the rotating machine 104. The first switching device 53A1 and the first switching device 53A2, which are the first switching device 53A, function as switching devices for switching each of the external battery 101 and the electric load 102 and the rotating machine 104 between a state in which electric power is supplied and a state in which electric power is not supplied.

The second switching device 53B1 and the second switching device 53B2, which are the second switching device 53B, function as switching devices for switching the battery unit 20 and the rotating machine 104 between a state in which electric power is supplied and a state in which electric power is not supplied.

The third switching device 53C and the fourth switching device 53D are connected in parallel to the third input/output terminal 142, and the electric load 103 is connected to a side opposite to the third switching device 53C.

The electric load 103 is an electric load having a constant-voltage requirement which requires that the voltage of the power supply is substantially constant or that the voltage fluctuation is within a predetermined range and is stable.

The electric load 103 is an in-vehicle navigation device, an in-vehicle audio device, meters, or the like, for example.

The third switching device 53C is connected to a connection part of the line between the first switching device 53A1 and the first input/output terminal 140, and the third switching device 53C is connected to the third input/output terminal 142.

The third switching device 53C functions as a switching device for switching between a state in which electric power is supplied from the external battery 101 to the electric load 103 and a state in which electric power is not supplied.

The third switching device 53C is a semiconductor switch such as a MOS or the like through which a medium current or a small current smaller than that of the first switching device 53A or the second switching device 53B flows.

A current path connecting the second switching device 53B1 and the battery unit 20 is disposed at a connection part of a line between the third switching devices 53C and the third input/output terminal 142.

This current path is switched by the fourth switching device 53D between a state in which electric power is supplied and a state in which electric power is not supplied.

The fourth switching device 53D functions as a switching device for switching between a state in which power can be supplied from the battery unit 20 to the electrical load 103 and a state in which power cannot be supplied.

The fourth switching device 53D is a system main relay in which a medium current or a small current smaller than that of the first switching device 53A or the second switching device 53B flows.

The rotating machine 104 includes an electric power generating function of generating electric power by rotation of a crankshaft of an engine, that is, regenerated electric power generation, and a power output function of imparting rotational force to the crankshaft, thereby constituting an ISG (Integrated Starter Generator).

The rotating machine 104 corresponds to the aforementioned generator motor (MG) 15.

The external battery 101 and the battery unit 20 are electrically connected in parallel to the rotating machine 104.

When the first switching device 53A is turned on, the external battery 101 is in a state where electric power is supplied from the rotating machine 104, and the regenerated electric power can be charged.

When the second switching device 53B is turned on, the battery unit 20 is in a state where electric power is supplied from the rotating machine 104, and the regenerated electric power can be charged.

Therefore, each of the first switching device 53A and the second switching device 53B forms a part of a large current path in which a relatively large current flows between the rotating machine 104 and each unit cell 21.

Next, an on/off state and a current flow state of each switching device according to the operating state of a hybrid vehicle will be described.

During deceleration, power regeneration that collects kinetic energy that decreases due to deceleration by the rotating machine 104 is performed.

During the power regeneration, the control unit 100 controls the first switching device 53A to an ON state, the second switching device 53B to an ON state, the third switching device 53C to an OFF state, and the fourth switching device 53D to an ON state.

As a result, the regenerated electric power generated by the rotating machine 104 is charged in the battery unit 20 or the external battery 101, and is also supplied to the electric load 102 and the electric load 103.

The rotating machine 104 is in a standby state during idling stop or during engine running. At this time, the control unit 100 controls the first switching device 53A to the ON state, the second switching device 53B to an OFF state, the third switching device 53C to the OFF state, and the fourth switching device 53D to the ON state.

As a result, the stored power of the external battery 101 is supplied to the electrical load 102, and the stored power of the battery unit 20 is supplied to the electrical load 103.

The rotating machine 104 plays a role as a starter when restarting from the idling stop state.

At this time, the control unit 100 controls the first switching device 53A to the ON state, the second switching device 53B to the OFF state, the third switching device 53C to the OFF state, and the fourth switching device 53D to the ON state.

The stored power of the external battery 101 is supplied to the rotating machine 104 and also supplied to the electric load 102, and the stored electric power of the battery unit 20 is supplied to the electric load 103.

As a result, the rotating machine 104 functions as a starter, enhances the rotation of the engine, and restarts the engine.

In an assist state such as an EV creep state or during acceleration, the rotating machine 104 operates by electric power supplied from the battery unit 20.

For example, the control unit 100 controls the first switching device 53A to the OFF state, the second switching device 53B to the ON state, the third switching device 53C to the ON state, and the fourth switching device 53D to the OFF state.

As a result, the stored power of the external battery 101 is supplied to the electrical load 102 and the electrical load 103, and the stored power of the battery unit 20 is supplied to the rotary machine 104.

Further, when in the assist state such as during acceleration and the stored power of the battery unit 20 is sufficient, the control unit 100 controls the first switching device 53A to the OFF state, the second switching device 53B to the ON state, the third switching device 53B to the OFF state, and the fourth switching device 53D to the ON state.

As a result, the stored power of the external battery 101 is supplied to the electrical load 102, and the stored power of the battery unit 20 is supplied to the rotary machine 104 and the electrical load 103.

The electrical components 52 of the battery pack 1 includes a first electrical component and a second electrical component having a smaller heating value than the first electrical component.

It can be said that the first electrical component is a component having a larger heating value than that of the second electrical component because a heat generation density which is a heating value per unit surface area of the first electrical component is larger than that of the second electrical component.

It can be said that the first electrical component is a component having a larger heating value than that of the second electrical component because a heat generation density which is a heating value per unit volume of the first electrical component is larger than that of the second electrical component.

Each of the first electrical component and the second electrical component can be constituted by the switching device 53 that controls current.

The first electrical component includes the first switching device 53A for controlling current between the rotating machine 104, which performs a power generating function and a power output function of the vehicle, and the external battery 101, and the second switching device 53B for controlling current between the rotating machine 104 and the battery unit 20.

The second electrical component includes the third switching device 53C for controlling current between the electric load 103 and the external battery 101, and the fourth switching device 53D for controlling current between the electric load 103 and the battery unit 20.

As shown in FIG. 2, the first electrical component is disposed at a position closer to the stays 32 than the second electrical component is in planar view.

Each of the switching devices 53 composing a group is disposed on the substrate 51 placed on the heat dissipation wall 35 so as to be capable of transferring heat.

A plurality of groups of switching devices 53 composing the first electrical component and the second electrical component are disposed on the substrate 51 in a positional relationship arranged in line in the width direction W1 of the vehicle.

The second switching device 53B is disposed at a position closest to the stay 32b projecting in the depth direction D1 from the first side wall 37 near the widthwise end portion 36 in planar view.

The stay 32a is disposed on an outer peripheral edge of the base 30 at a position away in the width direction W1 of the vehicle from the stay 32b closest to the second switching device 53B.

The first switching device 53A is positioned closest to the stay 32a in planar view.

The third switching device 53C and the fourth switching device 53D are disposed on the substrate 51 between the first switching device 53A and the second switching device 53B in an order from a side closer to the first switching device 53A.

Therefore, the third switching device 53C and the fourth switching device 53D are disposed at positions distant from the stays 32a and 32b, respectively, in planar view than the first switching device 53A and the second switching device 53B are.

In a case of a configuration shown in FIG. 2, the heat generated by the second switching device 53B is directed toward the stay 32b as indicated by a broken line arrow, and the heat generated by the first switching device 53A is directed toward the stay 32a as indicated by another broken line arrow.

In the present embodiment, the second switching device 53B and the first switching device 53A may be disposed with their positions switched.

In addition, the third switching device 53C and the fourth switching device 53D may be disposed with their positions switched.

In the battery pack 1, it is required to increase the heat dissipation performance of the second switching device 53B having the largest steady current among the plurality of groups of switching devices 53.

Therefore, it is preferable that the order of priority of disposition in positions close to the stays 32 in a planar view is given to the second switching device 53B and the first switching device 53A.

The battery unit 20 has a plurality of conductors that connect the plurality of unit cells 21 so as to enable energization. For example, the plurality of conductors connect a plurality of unit cells 21 in series.

The battery unit 20 has a plurality of monitor terminals. The monitor terminals are used for detecting at least the voltage of the unit cells 21.

The monitor connecting members 25 and the monitor terminals are electrically connected to each other. The monitor module 23 and the water sensor are integrally disposed by sharing the resin member 24. The monitor module 23 and the water sensor can be constructed as one component.

FIG. 4 shows the base 30 in a state in which the electrical circuit 50 such as the substrate 51 and the battery unit 20 are removed.

The base 30 has a plate shape or a dish shape. The base 30 has a shape called a shallow dish shape or a shallow cup shape. The shape of the base 30 in the container portion 31 is convex when viewed from below and concave when viewed from top.

The base 30 has a high rigidity against external force trying to warp it. The base 30 has high rigidity against the external force in the lateral direction in which the container portion 31 is opened, particularly in the width direction W1.

The base 30 has high rigidity with respect to the direction in which the plurality of unit cells 21 swell significantly.

The base 30 has the heat dissipation wall 35. A part of the electrical components 52 is disposed on the heat dissipation wall 35 via the substrate 51. Parts of the electrical components 52 are parts requiring heat dissipation. For example, the switch device 53 in the electrical circuit 50 is disposed on the heat dissipation wall 35.

Insulating sheets are disposed between the heat dissipation wall 35 and the electrical components 52, and between the heat dissipation wall 35 and the substrate. With this configuration, the heat of the electrical components 52 moves to the heat dissipation wall 35 via the insulating sheets.

The heat dissipation wall 35 is convex upward and concave from the bottom in the base 30. The heat dissipation wall 35 provides a concave heat radiating portion from the bottom on the lower surface of the base 30.

The substrate 51 installed on the base 30 has the high power section 52b on which the electrical components 52 for controlling the electric current to the unit cells 21 is disposed, and the low power section 52a on which the electrical components 52 to which a current smaller than that of the high power section 52b flows is disposed.

The high power section 52b occupies, for example, an area where the switch devices 53 are disposed. The low power section 52a occupies, for example, an area where the switch devices 53 are not present, and where the electrical components 52 to which the electric signal is inputted/outputted is disposed.

A part of the substrate 51 closer to the unit cell 21 located on a side opposite to the widthwise end portion 36 in the width direction W1 of the vehicle is the high power section 52b.

A part located on the widthwise end portion 36 is the low power section 52a. Therefore, the plurality of switch devices 53 are not installed on the part of the substrate 51 located above the widthwise end portion 36, and all of the switch devices 53 are located on the side opposite to the widthwise end portion 36 in the width direction W1 of the vehicle. The part located above the thin wall portions 36a is the low power section 52a.

Therefore, the plurality of switch devices 53 are not disposed on the part of the substrate 51 located above the thin wall portions 36a, and all of the switch devices 53 are disposed on the portion located on the opposite side to the thin wall portions 36a in the width direction W1 of the vehicle.

The container portion 31 is formed to have at least a side wall 31a, a side wall 31b, the bottom wall 31c, a back wall 31d, and a front wall 31e. The container portion 31 is an open container having an upwardly facing opening portion for installing the battery unit 20.

The side wall 31a and the side wall 31b are disposed on both sides of the container portion 31 in the width direction W1. The side wall 31a and the side wall 31b are disposed so as to face a stacking direction of the plurality of unit cells 21, that is, in the width direction W1.

An inner surface of the side wall 31a and an inner surface of the side wall 31b face inside the container portion 31. The inner surface of the side wall 31a and the inner surface of the side wall 31b are surfaces that face the battery unit 20 in the width direction W1 via a minute gap with the battery unit 20.

The side wall 31a has a plurality of bolt holes for fixing the battery case 22. The side wall 31b has a plurality of bolt holes for fixing the battery case 22.

Each of these bolt holes have a hole having a depth in the height direction H1 which is the assembling direction and a female thread formed on an inner surface of the hole. The side wall 31a and the side wall 31b are also formed with other bolt holes for fixing the cover 11 and other bolt holes for fixing parts for electrical connection.

The bottom wall 31c forms a bottom portion of the container portion 31. The bottom wall 31c is a wall connecting a lower end of the side wall 31a and a lower end of the side wall 31b.

An inner surface of the bottom wall 31c faces inside the container portion 31. The inner surface of the bottom wall 31c faces upward as an upper surface of the base 30 and faces the bottom surface of the battery unit 20.

The back wall 31d is located behind the container portion 31. The back wall 31d is a wall connecting the side wall 31a, the side wall 31b and the bottom wall 31c.

An inner surface of the back wall 31d faces inside the container portion 31 and faces a surface of the battery unit 20 on a side opposite to the monitor module 23.

The back wall 31d connects an upper portion of the side wall 31a and an upper portion of the side wall 31b.

The back wall 31d connects the side wall 31a and the side wall 31b. The back wall 31d provides a beam disposed between the side wall 31a and the side wall 31b. The back wall 31d opposes an external force acting to separate the side wall 31a and the side wall 31b outward and upward.

The front wall 31e is positioned at a front portion of the container portion 31. The front wall 31e is a wall connected to the bottom wall 31c and is a wall rising from the bottom wall 31c.

The front wall 31e may be a wall connecting the side wall 31a, the side wall 31b and the bottom wall 31c. The front wall 31e faces inside the container portion 31 and faces the monitor module 23 of the battery unit 20.

The front wall 31e is a part of a stepped-wall formed between the bottom wall 31c and the heat dissipation wall 35. The front wall 31e connects the side wall 31a and the side wall 31b.

The front wall 31e provides a beam disposed between the side wall 31a and the side wall 31b. The front wall 31e opposes an external force acting to separate the side wall 31a and the side wall 31b outward and upward.

Each of the plurality of bus bars 45, the bus bars 46, and the bus bars 47 has a portion extending along the battery unit 20. The plurality of bus bars 45, bus bars 46, and bus bars 47 extend in parallel.

The plurality of bus bars 45, the bus bars 46, and the bus bars 47 are disposed on both sides of the heat dissipating wall 35 and separated from each other. With such an arrangement, it is possible to provide the battery pack 1 suitable for connection with the electrical components 52 installed on the heat dissipation wall 35. This arrangement can contribute to shortening the current path through which a relatively large current, for example, interrupted by the switching devices 53 flows.

Therefore, it is possible to contribute to suppression of heat generated by the electrical circuit 50 by shortening the current path while promoting heat dissipation from the plurality of electrical components 52 by the heat dissipation wall 35.

The connecting members 80 are provided between the battery unit 20 and the heat dissipating wall 35. The connecting members 80 which are also parts of the bus bar unit 40 are adjacent to the heat dissipation wall 35.

Therefore, the connection member 80 can also contribute to suppression of the heat generated by the electrical circuit 50 since it is possible to form a heat dissipation path for heat transfer to the heat dissipation wall 35.

The battery unit 20 is mounted on the base 30. The battery case 22 is fixed to the base 30 by a plurality of bolts 71.

The plurality of bolts 71 are inserted into bolt holes provided in the base 30. The plurality of bolts 71 tighten the brackets disposed on the battery case 22 toward the base 30. The plurality of bolts 71 function as fastening members.

Next, effects obtained by the battery pack 1 of the first embodiment will be described.

The battery pack 1 includes the unit cells 21, the base 30, which is the part of the casing for accommodating the unit cells 21, having the heat dissipation wall 35 and the first side wall 37 disposed so as to be capable of transferring heat to the heat dissipation wall 35.

The battery pack 1 includes the stays 32 disposed on the first side wall 37 of the base 30 and fixed to the vehicle-side members 19, and the electrical components disposed so that the released heat can be transferred to the heat dissipation wall 35 or the first side wall 37.

The electrical components include the first electrical component and the second electrical component having a smaller heating value than the first electrical component.

The first electrical component is disposed at the position closer to the stays 32 than the second electrical component is in planar view.

According to the battery pack 1, by a configuration of disposing the first electrical component having a larger heating value than that of the second electrical component at the position closer to the stays 32 than the second electrical component is in planar view, it is possible to realize a positional relationship in which the second electrical component is not disposed in the heat dissipation paths from the first electrical component to the stays 32.

Because of the positional relationship, heat is dissipated from the first electrical component to the stays 32 in a configuration difficult to give a heat effect to the second electrical component, so that heat dissipation from the first electrical component to the vehicle-side members 19 is not inhibited, and heat dissipation to suppress the heat load from transferring from the first electrical component to the second electrical component can be performed.

Therefore, the heat dissipation performance of the battery pack 1 to the vehicle-side member 19 to which the base 30 is fixed from the electrical component can be improved.

In this manner, while reducing the size of the device, the heat dissipation performance from the electrical component such as the switch devices 53 in the battery pack 1 is improved, so that the temperature of the electrical components can be lowered.

By lowering the temperature of the electrical components, the permissible current value to be passed through the electrical components can be increased.

With this effect, the permissible current value in regeneration and output can be improved, so that the fuel consumption of the vehicle can be improved.

In addition, since speed of the temperature of the electrical components can be suppressed from rising by improving the heat dissipation performance, it is possible to limit the control for suppressing the current value from increasing and to provide the high performance battery pack 1.

The battery pack 1 includes one or the plurality of unit cells 21, the base 30, which is a part of the casing accommodating the unit cells 21, having the heat dissipation wall 35 and the first side wall 37, and the stays 32 fixed to the vehicle-side members 19 disposed on the first side wall 37 of the base 30.

The battery pack 1 includes heat generating elements disposed so that the released heat can be transferred to the heat dissipation wall 35, and the ribs 38 having surfaces extending along a direction of the shortest distance connecting the heat dissipation wall 35 and the first side wall 37, and connecting the heat dissipation wall 35 and the first side wall 37.

The heat generating elements are articles that generate heat in the battery pack 1, and are the electrical components 52 and the switching devices 53, for example.

According to the battery pack 1, the heat dissipation path through which heat of the heat generating elements can be transferred from the heat dissipating wall 35, the ribs 38, the first side wall 37, and the stays 32 in the order can be constructed by the ribs 38 connecting the first side wall 37 provided with the stays 32 and the heat dissipating wall 35.

Thereby, it is possible to efficiently transfer the heat generated by the heat generating elements transferred to the heat dissipation wall 35 to the stays 32 through the first side wall 37 and to enhance the heat dissipation performance from the heat generating elements to the vehicle-side members 19.

Therefore, the heat dissipation performance of the battery pack 1 from the heat generating element to the vehicle-side members 19 to which the base 30 is fixed can be improved, and a shrinkage on the base 30 can be suppressed from occurring by the ribs 38.

The battery pack 1 includes the plurality of unit cells 21, the casing that accommodates the unit cells 21, the stays 32 that are disposed on the base 30, which is a part of the casing, and are fixed to the vehicle-side members 19, and the thin wall portions 36a which are parts of the base 30.

The thin wall portions 36a are disposed at positions protruding outward from the unit cell 21 and the stays 32, and are fragile portions configured to have a strength that is more easily deformed by an external force than the portions around the base 30.

The battery pack 1 has the fragile portions, which are the thin wall portions 36a, as parts of the base 30 protruding outward from the unit cells 21 and the stays 32.

As a result, when the impact from the outside is applied to the base 30, it is possible to deliberately permit deformation, breakage or buckling of the thin wall portions 36a.

By the thin wall portions 36a buckling or the like at a position outside the unit cells 21 and the stays 32, the thin wall portions 36a act as a cushion for absorbing shocks so that it is possible to alleviate the load applied to the battery pack 1 from being transmitted to the inside of the thin wall portions 36a.

Therefore, according to the battery pack 1, it is possible to reduce the load and stress received by the unit cells 21 due to collision or the like, for example, so that the unit cells 21 can be protected.

The thin wall portions 36a are disposed at positions protruding from the unit cell 21 in a direction intersecting the direction in which the stays 32 protrude with respect to the unit cells 21.

According to this configuration, when an external force acts on the battery pack 1 in the intersecting direction, the thin wall portions 36a can be deformed, damaged, buckled, or the like by the external force before the stays 32 are.

The external force acting on the stays 32 can be reduced by an external force absorbing effect of the buckling of the thin wall portions 36a, and damages to the stays 32 can be suppressed from occurring.

Therefore, according to the battery pack 1, it is possible to protect the fixing function with respect to the vehicle-side members 19 by reducing the damages to the stays 32, so that the unit cell 21 and the high power section 52b can be protected from being damaged by a large movement of the battery pack 1.

The thin wall portions 36a are disposed at positions protruding outward with respect to the width direction W1 of the vehicle than the unit cell 21 and the stays 32 are.

According to this configuration, when an external force acts on the side portion of the vehicle due to a side collision of the vehicle or the like, for example, the thin wall portions 36a can first be deformed, damaged, buckled, etc. by external force.

By the external force absorbing effect due to buckling of the thin wall portions 36a or the like at the time of the side collision of the vehicle or the like, the external force acting on the stays 32 can be reduced, thus the damage to the stays 32 can be reduced.

Therefore, according to the battery pack 1, it is possible to protect the fixing function with respect to the vehicle-side members 19 at the time of the side collision of the vehicle or the like by reducing the damages to the stays 32, so that the unit cells 21 and the high power sections 52b can be suppressed from being damaged by large moving of the battery pack 1.

The stays 32 are positioned at positions protruding more than the thin wall portions 36a do with respect to the longitudinal direction of the vehicle.

The thin wall portions 36a are disposed at positions protruding in the width direction W1 of the vehicle more than the vehicle members 19 to which the stays 32 are fixed are.

According to this configuration, since the thin wall portions 36a are disposed at the positions protruding in the width direction W1 of the vehicle more than the vehicle-side members 19 are, when an external force acts on the side portion of the vehicle due to, for example, a side collision of the vehicle, the thin wall portions 36a buckle or the like, so that the vehicle-side members 19 and the stays 32 can be protected.

Therefore, according to the battery pack 1, since the external force can be absorbed more reliably and firstly by the thin wall portions 36a, the fixing function between the battery pack 1 and the vehicle-side members 19 can be protected.

A portion of the substrate 51 placed on the base 30 located on the side opposite to the thin wall portions 36a in the width direction W1 of the vehicle corresponds to the high power section 52b where the electrical components 52 for controlling current to the unit cells 21 is disposed.

A portion of the substrate 51 located above the thin wall portions 36a corresponds to the low power section 52a where the electrical components 52 through which a current smaller than the high power section 52b flows is disposed.

According to this configuration, when an external force acts on the side portion of the vehicle due to a side collision of the vehicle or the like, for example, the low power section 52a is damaged together with buckling of the thin wall portions 36a and the like, but the high power section 52b can be protected instead.

Thereby, it is possible to provide the battery pack 1 with enhanced safety that can protect the high voltage portion 52b through which a large current flows.

The plurality of switching devices 53 for controlling the current to the unit cells 21 are not disposed on the portion of the substrate 51 located above the thin wall portions 36a, but all of them are disposed on the side opposite to the thin wall portions 36a in the width direction W1 of the vehicle.

According to this configuration, when the thin wall portions 36a buckles or the like at a position outside the high power section 52b, the thin wall portions 36a act as a cushion for absorbing shocks, so that it is possible to alleviate the load applied to the battery pack 1 from being transmitted to the high power section 52b.

Therefore, according to the battery pack 1, even when an external force is applied due to a collision or the like, for example, the high power section 52b through which a large current flows can be protected preferentially over the low power section 52a, so that a battery pack 1 with increased safety can be provided.

Second Embodiment

In a second embodiment, a positional relationship between switching devices 53 and stays 32, which is another embodiment of the first embodiment, will be described with reference to FIG. 7.

The second embodiment has the same configuration as that of the first embodiment except for the positional relationship between the switching devices 53 and the stays 32, and has the same functions and effects.

In the following embodiments, contents different from those of the first embodiment will be described.

Figure 7:
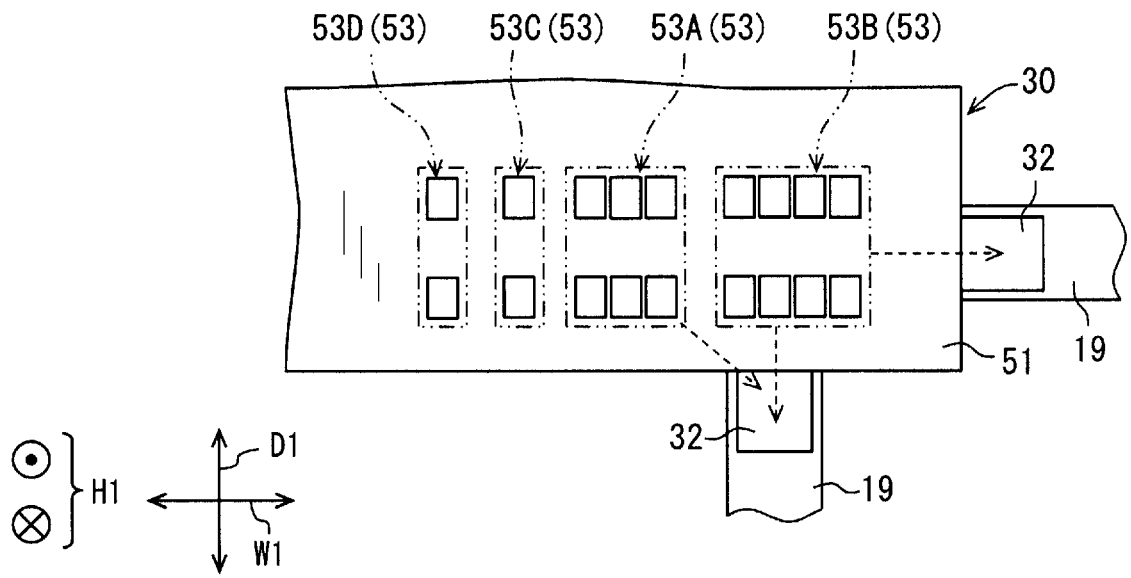
FIG. 7 shows a partial planar view showing a positional relationship between switching devices and stays in the battery pack according to a second embodiment.

As shown in FIG. 7, a second switching device 53B is disposed at a position closest to one stay 32 that protrudes in a direction in which a plurality of group of switching devices 53 are arranged in planar view.

As described above, the switching devices 53 of the plurality of groups composing a first electrical component and a second electrical component are arranged in line in the width direction W1 of the vehicle.

A first switching device 53A is disposed adjacent to the second switching device 53B on a side opposite to the stay 32.

A third switching device 53C is disposed adjacent to the first switching device 53A on a side opposite to the stay 32.

A fourth switching device 53D is disposed adjacent to the third switching device 53C on a side opposite to the stay 32.

Further, as shown in FIG. 7, the second switching device 53B is disposed at a position closest to another stay 32 that is disposed at a position protruding in a direction intersecting the direction in which the plurality of group of switching devices 53 are arranged in planar view.

The first switching device 53A is disposed at the second closest position to this stay 32.

The third switching device 53C is disposed at the third closest position to this stay 32.

The fourth switching device 53D is disposed at a position farthest from the stay 32.

Therefore, the switching device 53 is disposed such that, with respect to these stays 32, the second switching device 53B, the first switching device 53A, the third switching device 53C, and the fourth switching device 53D are arranged in line in this order in the width direction W1 of the vehicle from a side closer to the stays 32.

In a case of the embodiment shown in FIG. 7, the heat generated by the second switching device 53B and the first switching device 53A is directed toward the stays 32 via a heat dissipation wall 35 and side walls as indicated by broken line arrows.

In addition, the second switching device 53B and the first switching device 53A may be disposed with their positions switched.

The third switching device 53C and the fourth switching device 53D may be disposed with their positions switched.

Even with the configuration disclosed in the second embodiment, heat generation of the second switching device 53B or the first switching device 53A is most easily transferred to the stays 32.

Therefore, in heat transfer paths to the stays 32, thermal influence on the third switching device 53C and the fourth switching device 53D can be suppressed.

Third Embodiment

In a third embodiment, a positional relationship between a switching devices 53 and a stays 32, which is another embodiment of the first embodiment, will be described with reference to FIG. 8.

The third embodiment has the same configuration as that of the first embodiment except for the positional relationship between the switching devices 53 and the stays 32, and has the same functions and effects.

Figure 8:
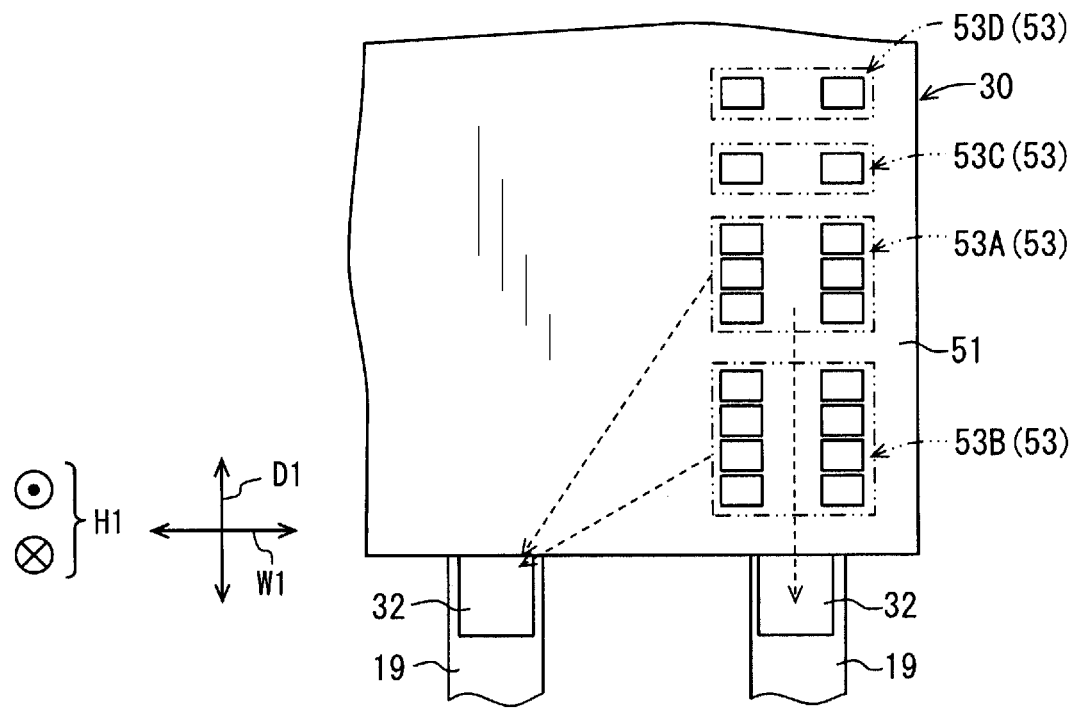
FIG. 8 shows a partial planar view showing a positional relationship between switching devices and stays in the battery pack according to a third embodiment.

As shown in FIG. 8, a second switching device 53B is disposed at a position closest to one stay 32 that protrudes in a direction in which a plurality of group of switching devices 53 are arranged in planar view.

As described above, the switching devices 53 of the plurality of groups composing a first electrical component and a second electrical component are arranged in line in the longitudinal direction (the depth direction D1) of the vehicle.

A first switching device 53A is disposed adjacent to the second switching device 53B on a side opposite to the stay 32.

A third switching device 53C is disposed adjacent to the first switching device 53A on a side opposite to the stay 32, and a fourth switching device 53D is disposed adjacent to the third switching device 53C on a side opposite to the stay 32.

In addition, as shown in FIG. 8, another stay 32 is disposed on an outer circumferential edge of a base 30 at a position apart from the above-described stay 32 closest to the second switching device 53B in the width direction W1 of the vehicle.

The second switching device 53B is disposed closest to the other stay 32 in planar view, and the first switching device 53A is disposed at the second closest position to the stay 32.

The third switching device 53C is disposed at the third closest position to the stay 32, and the fourth switching device 53D is disposed at the furthest position to the stay 32.

Therefore, the switching device 53 is disposed such that, with respect to these stays 32, the second switching device 53B, the first switching device 53A, the third switching device 53C, and the fourth switching device 53D are arranged in line in this order in the longitudinal direction of the vehicle from a side closer to the stays 32.

In a case of the embodiment shown in FIG. 8, the heat generated by the second switching device 53B and the first switching device 53A is directed toward the stays 32 via a heat dissipation wall 35 and side walls as indicated by broken line arrows.

Also in the case of the third embodiment, the second switching device 53B and the first switching device 53A may be disposed with their positions switched, and the third switching device 53C and the fourth switching device 53D may be disposed with their positions switched.

Even with the configuration disclosed in the third embodiment, heat generation of the second switching device 53B or the first switching device 53A is most easily transferred to the stays 32, therefore, in heat transfer paths to the stays 32, thermal influence on the third switching device 53C and the fourth switching device 53D can be suppressed.

Fourth Embodiment

In a fourth embodiment, a positional relationship between a switching devices 53 and a stays 32, which is another embodiment of the first embodiment, will be described with reference to FIG. 9.

The fourth embodiment has the same configuration as that of the first embodiment except for the positional relationship between the switching devices 53 and the stays 32, and has the same functions and effects.

Figure 9:
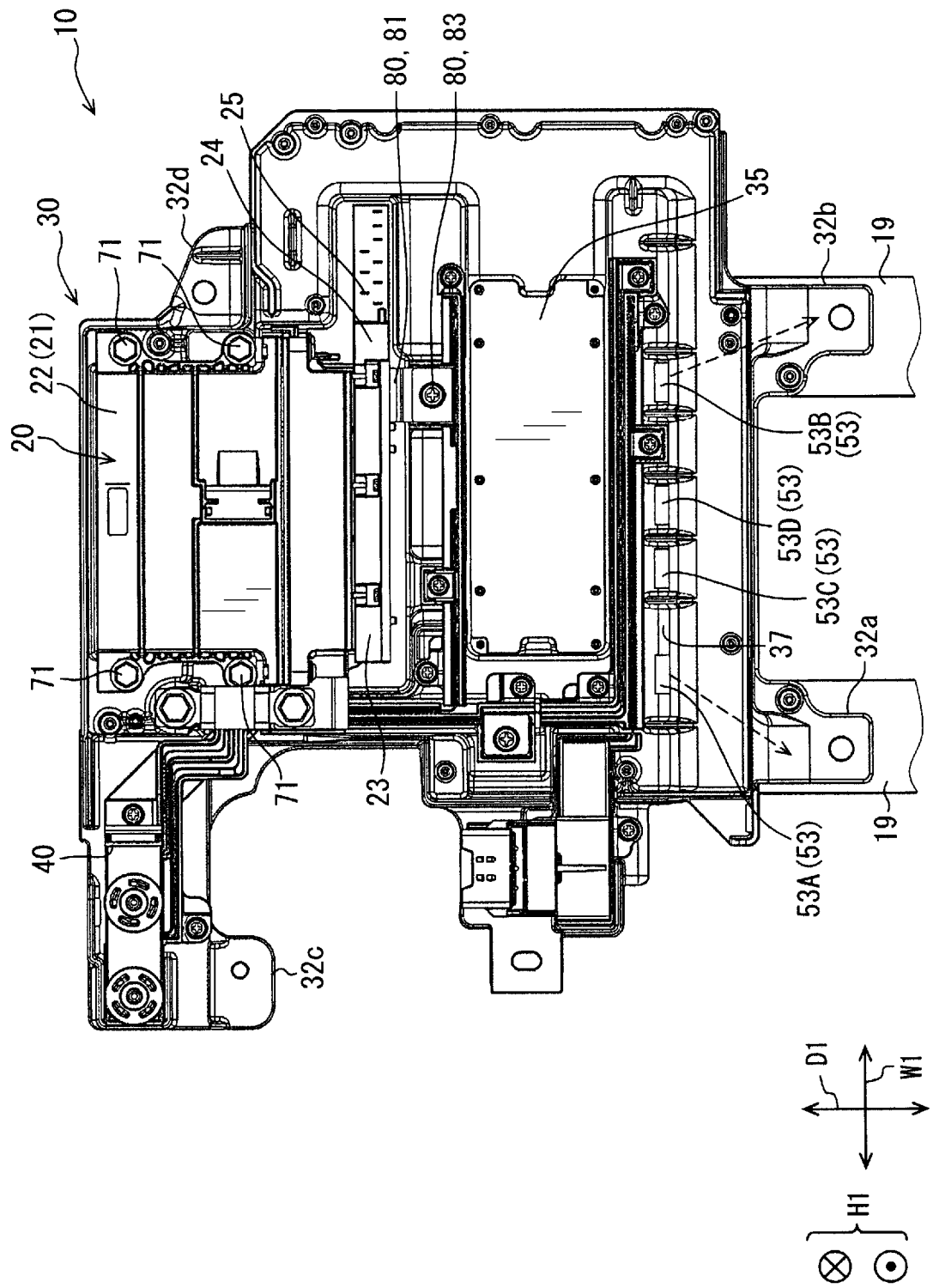
FIG. 9 shows a planar view showing a positional relationship between switching devices and stays in the battery pack according to a fourth embodiment.

As shown in FIG. 9, each group of switching devices 53 is disposed on a wall surface of a first side wall 37.

A plurality of groups of switching devices 53 composing a first electrical component and a second electrical component are disposed on a wall surface of a first side wall 37 in a positional relationship arranged in line in the width direction W1 of the vehicle.

A second switching device 53B is disposed at a position closest to one stay 32 that protrudes in the depth direction D1 from the first side wall 37 in planar view.

Another stay 32 is disposed on an outer peripheral edge of a base 30 at a position apart from the above-described stay 32 closest to the second switching device 53B in the width direction W1 of the vehicle.

The first switching device 53A is disposed closest to the other stay 32 in a planar view.

The third switching device 53C and the fourth switching device 53D are disposed on the first side wall 37 between the first switching device 53A and the second switching device 53B in an order from a side closer to the first switching device 53A.

Therefore, the third switching device 53C and the fourth switching device 53D are disposed at positions distant from the stays 32, respectively, in planar view than the first switching device 53A and the second switching device 53B are.

In a case of the embodiment shown in FIG. 9, the heat generated by the second switching device 53B and the first switching device 53A is directed toward the stays 32 as indicated by broken line arrows.

Also in the case of the fourth embodiment, the second switching device 53B and the first switching device 53A may be disposed with their positions switched, and the third switching device 53C and the fourth switching device 53D may be disposed with their positions switched.

Even with the configuration disclosed in the fourth embodiment, heat generation of the second switching device 53B or the first switching device 53A is most easily transferred to the stays 32, therefore, in heat transfer paths to the stays 32, thermal influence on the third switching device 53C and the fourth switching device 53D can be suppressed.

Other Embodiments

The disclosure of this specification is not limited to the illustrated embodiments. The disclosure includes the illustrated embodiments and modifications by those skilled in the art based thereon.

For example, the disclosure is not limited to the combination of components and elements shown in the embodiments, and various modifications can be made.

The disclosure can be implemented in various combinations. The disclosure may have additional parts that may be added to the embodiments. The disclosure includes parts and elements of the embodiments being omitted.

The disclosure includes replacements of parts, elements, or combinations between one embodiment and another. The disclosed technical scope is not limited to the description of the embodiments.

The technical scope disclosed is indicated by the description of the claims and should be understood to include all modifications within the scope and meaning equivalent to the description of the claims.

The number of the switching devices 53 constituting each of the first electrical component and the second electrical component is not limited to the number disclosed in the above embodiments.

Further, the group of the switching devices 53 constituting the first electrical component and the second electrical component are is not limited to the classification of the first switching device 53A, the second switching device 53B, the third switching device 53C, and the fourth switching device 53D.

A configuration may be adopted in which a member or material having thermal conductivity is embedded or filled between adjacent ribs 38 in the above-described embodiment. Such a member or the material is, for example, a metal of a material different from that of the base 30, a gel, a resin, or the like.

A resin containing a metal having thermal conductivity (for example, alumina-containing resin) can be adopted as the resin, for example.

The electrical circuit 50 includes a plurality of switch devices 53 in the above embodiment. Alternatively, the electrical circuit 50 may include a single switch device 53.

Further, the electrical circuit 50 may include a switch array in which a plurality of switch devices 53 are accommodated in a circuit package. The switch array may be mounted on the substrate 51 or may be supported away from the substrate 51.

The thin wall portions 36a in the above embodiment may be disposed over the entire length in the longitudinal direction of the vehicle at the widthwise end portion 36 of the base 30.

In this case, the thin wall portion is constituted by one groove portion extending over the entire length in the longitudinal direction of the vehicle at the widthwise end portion 36 and has a wall thickness thinner than the peripheral thickness at the widthwise end portion 36.

The thin wall portions are fragile portions having lower rigidity than the surroundings, and are constituted by a groove portion that is recessed like a band from the lower surface side of the base 30 opposed to the vehicle-side members 19.

According to this thin wall portion, the widthwise end portion 36 is more easily broken by an external impact than the thin wall portion is, and it is possible to provide a casing which is easily buckled.

By buckling so that the widthwise end portion 36 folds over the entire length in the longitudinal direction of the vehicle, the impact transmitted to the container portion 31 can be reduced and the unit cells 21 can be protected.

In the above embodiment, the unit cells 21 constituting the battery unit 20 may have a configuration in which the exterior case is a thin flat plate shape, and the exterior case is formed of a laminate sheet, for example. The laminate sheet is made of a highly insulating material.

The unit cell 21 has, for example, an internal space of a flat container sealed by sealing end portions thereof by heat-sealing the end portions of the laminate sheet folded in half.

A battery body portion including an electrode assembly, an electrolyte, terminal connecting portions, a part of a positive electrode terminal portion, and a part of a negative electrode terminal portion are incorporated in this internal space.

Therefore, in the plurality of unit cells 21, the peripheral portion of the flat container is sealed so that the battery main body portion is contained in a sealed state inside the flat container.

Each of the unit cells 21 has a pair of electrode terminals drawn outward from the flat container.

As the unit cell 21 constituting the battery unit 20 in the above embodiment, a single cell having a columnar outer shape may be used, for example.

In the above-described embodiment, the plurality of unit cells 21 constituting the battery unit 20 may be installed in a state where they are brought into contact with each other without forming a gap between adjacent unit cells, or may be a configuration providing a predetermined gap therebetween at the same time.

What is claimed is:

1. A battery pack comprising:
    a secondary battery;
    a casing that accommodates the secondary battery;
    a base which is a part of the casing and has a heat dissipation wall and a side wall disposed so as to transfer heat to the heat dissipation wall;
    two fixing portions disposed on the side wall in the base and configured to be fixed to a vehicle-side member, the fixing portions being configured to mount the battery pack to a vehicle having the vehicle-side member;
    two first electrical components disposed so that released heat can be transferred to the heat dissipation wall or the side wall;
    two second electrical components disposed so that released heat can be transferred to the heat dissipation wall or the side wall, the second electrical components each having a smaller heat generation density than both of the first electrical components, each of the first electrical components being disposed closer than both of the second electrical components to one of the fixing portions in planar view; and
    two dissipation paths through which the heat transferred from each first electrical component to the heat dissipating wall dissipates to the vehicle-side member through a respective nearest fixing portion,
    wherein neither second electrical component is disposed in one of the heat dissipation paths.

2. The battery pack according to claim 1, wherein the first electrical components and the second electrical components are switching devices that control current.

3. The battery pack according to claim 2, wherein
    the first electrical components each include:
        a first switching device for controlling current between a rotating machine, which performs a power generating function and a power output function of the vehicle, and an external battery; and
        a second switching device for controlling current between the rotating machine and the secondary battery, and
    the second electrical components each include:
        a third switching device for controlling current between electric load of the vehicle and the external battery; and
        a fourth switching device for controlling current between the electric load and the secondary battery.

4. The battery pack according to claim 1, wherein the first and second electrical components are disposed between the two fixing portions in a direction.

5. The battery pack according to claim 4, wherein the second electrical components are disposed between the first electrical components in the direction.

* * * * *